United States Patent [19]

Butt

[11] Patent Number: 4,607,276
[45] Date of Patent: Aug. 19, 1986

[54] TAPE PACKAGES

[75] Inventor: Sheldon H. Butt, Godfrey, Ill.

[73] Assignee: Olin Corporation, New Haven, Conn.

[21] Appl. No.: 587,411

[22] Filed: Mar. 8, 1984

[51] Int. Cl.[4] ............ H01R 9/00; H01L 23/40; H01L 23/48

[52] U.S. Cl. .................... 357/79; 357/74; 357/81; 357/69; 361/406

[58] Field of Search ............ 174/52 FP; 357/79, 74, 357/81; 361/395, 406, 421

[56] References Cited

U.S. PATENT DOCUMENTS

| | | | |
|---|---|---|---|
| 3,553,828 | 1/1971 | Starger | 357/74 |
| 3,676,292 | 7/1972 | Pryor et al. | 29/195 |
| 3,781,596 | 12/1973 | Galli et al. | 174/52 FP |
| 3,838,443 | 9/1974 | Laighton | 357/81 |
| 4,092,664 | 5/1978 | Davis, Jr. | 357/81 |
| 4,117,508 | 9/1978 | Koenig | 357/74 |
| 4,132,856 | 1/1979 | Hutchison et al. | 174/52 FP |
| 4,138,691 | 2/1979 | Bonkohara et al. | 357/68 |
| 4,172,261 | 10/1979 | Tsuzuki et al. | 357/81 |
| 4,180,828 | 12/1979 | Schermer et al. | 357/79 |
| 4,188,636 | 2/1980 | Sato et al. | 357/69 |
| 4,312,926 | 1/1982 | Burns | 357/69 |
| 4,330,790 | 5/1982 | Burns | 357/70 |
| 4,415,025 | 11/1983 | Horvath | 165/185 |
| 4,466,183 | 8/1984 | Burns | 357/69 |
| 4,484,381 | 11/1984 | Ellis et al. | 361/386 |

OTHER PUBLICATIONS

J. Gow, III, *Semiconductor Device Package*, IBM Technical Disclosure Bulletin, vol. 5, No. 12, p. 10, (5/1963).
E. E. Zirnis, *Semiconductor Module with Improved Air Cooling*, IBM Technical Disclosure Bulletin, vol. 20, No. 5, p. 1768 (10/1977).
"Chip-Carriers, Pin Grid Arrays Change the PC--Board Landscape" by Jerry Lyman, *Electronics*, Dec. 29, 1981, pp. 65-75.

*Primary Examiner*—James W. Davie
*Assistant Examiner*—Vangelis Economou
*Attorney, Agent, or Firm*—Howard M. Cohn; Barry L. Kelmachter; Paul Weinstein

[57] ABSTRACT

The present invention is directed to Tape Packages adapted to house semiconductor devices. The packages comprise a base component having a cover component disposed thereon to form an enclosure to house the semiconductor. A tape lead frame is disposed between the base and the cover and has a plurality of lead fingers extending into the enclosure for electrical connection to the semiconductor component. A spring between the base and the semiconductor device presses the semiconductor device into contact with the cover component. The spring comprises at least one of the lead fingers which is bonded to the semiconductor device and formed into an arch-like shape which contacts the base component.

20 Claims, 8 Drawing Figures

TAPE PACKAGES

The present invention relates to U.S. patent application Ser. No. 587,433, entitled "Tape Bonding Material And Structure For Electronic Circuit Fabrication" by Sheldon H. Butt, filed Mar. 8, 1984.

While the invention is subject to a wide range of of applications it is especially suited for housing integrated circuits on to foil gage material which serves as the lead frame and bonding tape.

The term "Tape Packages" identifies a type of surface mounted package wherein the lead frame and the bonding tape are combined into a single element made from a foil gage material. Conventionally, these are used for surface mounted semiconductor type components. A schematic illustration of a typical "Tape Pak" is shown in FIG. 1.

In the assembly of a conventional Tape Pak, a semiconductor chip is attached to the tape leads in a conventional manner such as by thermocompression, thermosonic or ultrasonic bonding methods. After this preassembly, the tape with the die in place is assembled between two glazed ceramic components which form the base and cover of the package. The external leads which extend out of the package may then be formed into either the typical "j" shape or the typical "gull-wing" shape. These are the two general types of lead configurations commonly used in surface mounted devices. A "j" lead configuration is shown on the left-hand side of FIG. 1 and a gull-wing configuration is shown on the right-hand side of the figure. It will also be noted that the chip in FIG. 1 is in an inverted position, i.e., with its face down. The assembly may, however, be made with the die in a face up position if desired. It is evident that the heat dissipation characteristics of such a package are unusually poor. This is because the die is suspended within the enclosure and makes no more than somewhat incidental mechanical contact to either of the ceramic components. It is not feasible to mount the die directly onto a ceramic package component. This is because the normal means of attaching a die to a ceramic package component is with a gold-silicon eutectic brazed bond. Eutectic brazed bonding, whether with gold silicon or with gold tin, requires that the die be scrubbed or rubbed on the surface to which it is to be mounted. This step may break up any oxides which would inhibit the bonding process. This rubbing step cannot be done effectively after the leads have been attached to the die. It must be kept in mind that the bond between the die and the leads is rather delicate and could be easily broken if subjected to even a relatively small amount of stress.

Since the base and cover components are manufactured from relatively low expansivity ceramic material, the sealing glass between them can be a low expansivity glass. Correspondingly, the tape can be made from a low expansivity alloy, such as nickel or iron alloys like 42 Ni-Fe or Kovar, both of which have a thermal conductivity which is only approximately 3% that of copper. The tape thicknesses are generally in the range of about between 0.002" to about 0.004". Combining the poor thermal conductivity of the low expansivity alloys with the thin tape commonly used, puts severe limits upon the heat which can be dissipated through the leads is encountered. These factors limit the use of the present technology Tape Packages to devices which do not generate much heat.

Typical TAB packages are disclosed in U.S. Pat. No. 4,330,790 to Burns and U.S. Pat. No. 4,132,856 to Hutchinson et al. Also, a description of new technology with respect to chip carriers and TAB is presented in an article entitled "Chip Carriers, Pin Grid Arrays Change The PC-Board Landscape" by Jerry Lyman, *Electronics*, Dec. 29, 1981, Pages 65–75.

Tape PAKS have two particular advantages. Firstly, all of the bonds between the tape and the lead frame and between the tape and the bonding pads on the die are fabricated in a single operation rather than the multiple operations required in wire bonding individual wires between a lead frame and a die.

Secondly, the tape is produced from very thin foil, commonly having a thickness from between about 0.0014 to about 0.0042inches. This permits the formation of very narrow internal tips of the tape leads. They may be constructed to be narrower than the flattened ball formed in the ball bonding operation for wire bonding. This allows the possibility of using narrower bonding pads around the periphery of the die than possible where ball bonding is used. This is extremely advantageous in the case of semiconductor devices which require a relatively large number of interconnections such as a complex microprocessor which may require over a hundred and fifty of such interconnections.

In a conventional semiconductor die, the bonding pads around the periphery of the die are essentially flush with the top surface of the die. For processing considerations, they do not extend out quite to the edge of the die. If flat tape is bonded directly to the flush bonding pads on the die, the tape may contact the outer periphery of the die as well as the pad and cause a short circuit. This potential problem can be dealt with in two ways. The most conventional method is to bump the bonding pad on the die by raising its surface somewhat above the general surface level of the die. This acts to raise the tape safely above the edge of the die. An alternative which is now becoming popular is to bump the tape and use a flat die without a raised pad.

Commonly, one or two ounce thickness copper foil (0.0014" or 0.0028") is used on flat tapes while two or three ounce copper foil is used on bumped tape. The extra thickness on the bumped foil is required to leave metal from which the bump is fabricated while etching away the material in the remainder of the foil.

The ability to form lead fingers having relatively longer span, so as to reach a more central part of the die, could be advantageous in a lead frame having a large number of leads. The minimum width of the internal ends of the leads is limited by the thickness of the lead frame material as is also the minimum spacing between the leads. Generally, the stamping rules dictate that the distance between the fingers being pierced out cannot be much less than the thickness of the material. For example, a lead frame having a thickness of 0.010" can tolerate the tips having a minimum width of approximately 0.010" and a minimum spacing between the leads of approximately 0.010". These size factors limit the minimum size of the central periphery defined by the lead tips. The minimum size of the central periphery and the maximum permissible span between the lead tips and the bonding pads on the die define the minimum die dimensions which may be used with a lead frame having a given number of leads and a given thickness. As the size of complex semiconductor devices decreases, the minimum die size required by the limitations on the lead frame geometry and the interconnection span is greater than the minimum geometry required to accomodate the functions on the semiconductor chip. The chip in effect, becomes larger in its overall dimentions than required. Also, there are die designs in which it would be advantageous to interconnect to a position on the die other than around the periphery if only a longer span could be tolerated.

The essentials of interconnection bonding are basically the same as in other types of metallurgical bonding. Through a combination of differential movement of the two elements to be bonded, a metallurgical bond is formed. The bonding parameters may be advantageously influenced by the application of heat and pressure (thermocompression bonding), by a combination of heat and ultrasonic energy (thermosonic bonding) or by substantial input of ultrasonic energy (ultrasonic bonding).

The characteristics of the bonding pads on the semiconductor die are limited to those which may be obtained during the deposition of a single or multiple layers of metallization used in creating the pad. Usually aluminum is the material chosen for the bonding pads. There is a further limitation in that the maximum unit pressure bonding to the die is selected so as to avoid fracture of the underlying brittle silicon die material.

The choice of the interfacial material to be used in the tape may be selected so as to avoid the formation of undesirable intermetallics between the tape and the lead frame or between the tape and the bonding pad. For instance, the bonding of copper and copper alloy members to members containing aluminum often result in the formation of copper-aluminum intermetallic compounds. These copper aluminum intermetallic compounds tend to be brittle and degrade the integrity of the bond between the members. They may also adversely affect the electrical conductivity characteristics of the bonded members. To avoid formation of these intermetallic compounds, semiconductor manufacturers, often rely on materials such as nickel and its alloys or iron and its alloys as mentioned above. Of course, the attendant problems from insufficient heat transfer through the lead frame still exist.

U.S. Pat. No. 4,498,121 entitled "Copper Alloys For Suppressing Growth Of Cu-Al Intermetallic Compounds" by Breedis et al. discloses copper alloys which may be bonded to aluminum containing members so as to reduce the formation of undesirable copper-aluminum intermetallic compounds.

U.S. patent application Ser. No. 587,433 entitled "Tape Bonding Material and Structure For Electronic Circuit Fabrication" by Sheldon H. Butt, discloses another unique application of transport metal tape including providing the tape of a biclad or triclad material so that optimal bonding characteristics can be obtained with both the lead frame and the terminal pad materials. Further, the tape is disclosed with arches to serve the functions of improved heat dissipation and the ability to bond to a more central portion of the die.

It is a problem underlying the present invention to provide a Tape Package having good heat dissipation characteristics.

It is an advantage of the present invention to provide a Tape Package which obviates one or more of the limitations and disadvantages of the described prior arrangements.

It is a further advantage of the present invention to provide a Tape Package having a semiconductor device pressed against one of the package components.

It is yet a further advantage of the present invention to provide a Tape Package which is relatively inexpensive to manufacture.

Accordingly, there has been provided a Tape Package adapted to house an electronic component. The package comprises a base component and a cover component disposed on the base component to form an enclosure to house the electronic component. A tape lead frame is bonded between the base component and the cover component. The tape lead frame has a plurality of lead fingers extending into the enclosure and adapted for electrical connection to the electrical component. A spring device between the base component and the electrical component presses the electrical component into contact with the cover component. The spring device comprises at least one of the lead fingers connected to opposite sides of the electrical component and formed into an arch-like shape within the enclosure.

In another embodiment of the present invention, the spring device is separate from the lead frame and independently bonded onto the electronic component. The spring device performs the dual function of improving heat dissipation from the component as well as pressing the component against one of the components that form the casing of the package.

The invention and further developments of the invention are now elucidated by means of preferred embodiments shown in the drawings:

BRIEF DESCRIPTION OF THE DRAWINGS

FIG. 3 is a schematic representation of a section of transport tape material having lead fingers stamped in;

Figure 1:
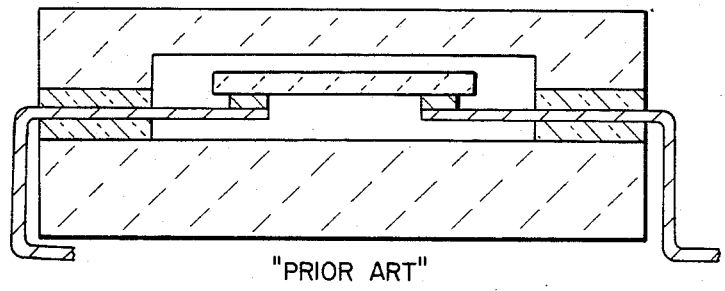
FIG. 1 is a schematic representation of a Tape Package known in the prior art.

The present invention is particularly directed to a Tape Package 10 adapted to house an electronic component 12. The package comprises a base component 14 and a cover component 16 disposed on the base component to form an enclosure 18 to house the electronic component 12. A tape lead frame 20 is bonded between the base component and the cover component. The lead frame has a plurality of lead fingers 22 which extend into the enclosure and are adapted for electrical connection to the electrical component 12. A spring device 24 is disposed between the base component 14 and the electrical component 12 to press the electrical component into contact with the cover component 16. The spring device 24 comprises at least one of the lead fingers 22 which is bonded to at least two locations on the terminal component and is formed into an arch-like shape within the enclosure.

Figure 2:
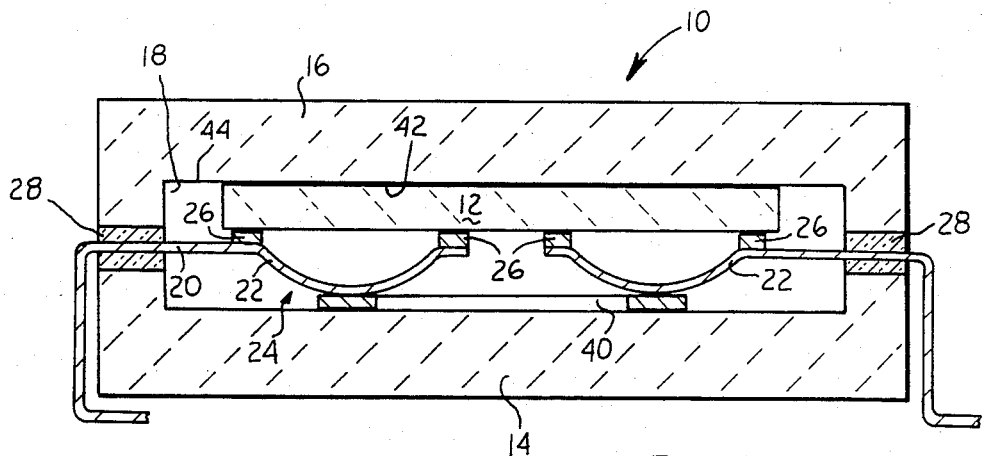
FIG. 2 is a schematic representation of a Tape Package in accordance with the present invention.

Referring to FIG. 2, there is shown an embodiment of a Tape Package in accordance with the present invention which is adapted to house an electric component 12 such as a conventional semiconductor die. The semiconductor die may have a plurality of terminal bonding pads 26 disposed about the periphery of the die and at any desired central locations. The pads may either be raised above the surface of the die or flush with the surface. For purposes of the description of this embodiment, the terminal pads will be considered to be flush with the surface of the die.

The Tape Package comprises a base component 14 and a cover component 16 which are formed of a ceramic material as known in the prior art. The base and cover component may be bonded together by a conventional low expansivity sealing glass 28 to form an enclosure 18 in which the die 12 may be hermetically sealed.

The present invention is particularly directed to the tape lead frame 20 having a unique shape with spring characteristics to enhance the thermal dissipation within the Tape Package. The tape lead frame material may have a thickness of from about 0.0014 to about 0.0042 inches, and preferably between about 0.002 to about 0.004 inches. The tape may be thinner or thicker than these ranges if required.

The tape leads are preferably made of a low expansivity material such as nickel alloy or iron alloy as described hereinabove. Preferably, the material may consist essentially of up to 100% nickel and the remainder copper and more preferably, 20 to 40% nickel and the remainder copper. The important advantage of using a material containing nickel is that when bonded to aluminum containing elements, such as the terminal pads, there is significant reduction in the level of copper-aluminum intermetallic compounds. More details of this advantage are described in U.S. Pat. No. 4,498,121 mentioned hereinabove.

Each of the lead fingers 22 may be bonded to at least two terminal bonding pads on the surface of the semiconductor die 12. One of the terminal bonding pads would preferably be near the periphery of the die while the other one in a more centrally located position. Then the terminal lead would be preferably curved into an arched spring device between the two bond points. Although two terminal lead fingers are illustrated in FIG. 2 as being curved, it is within the terms of the present invention to provide this curve in one or more of the terminal lead fingers as desired. It is thought to be desirable that at least four lead fingers each connected to a corner of the semiconductor die would be preferable. This might be easily accomplished by using a metal tape of the type illustrated in FIG. 3. It is however, within the scope of the present invention to form the spring device from any of the tape fingers and to connect them to any of the terminal pads on the die as long as the spring characteristics are sufficient to press the die against an inner surface of the package.

Figure 3:
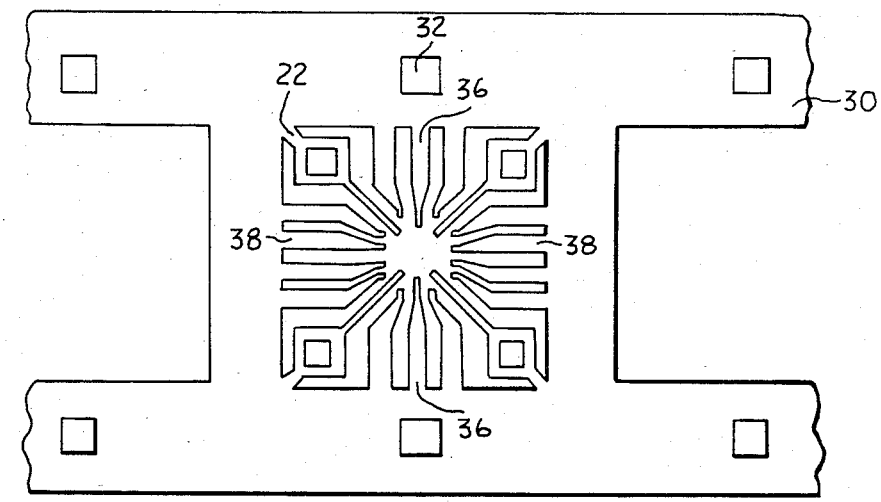

Referring to FIG. 3, there is shown a fragment of metal tape 30 which has been prepared to accommodate a semiconductor device 12. Only one pattern is shown, however, it is understood that a plurality of such patterns exist along the tape. Holes 32 act to index and transport the tape in the following process. A plurality of metal fingers 22, 36 and 38 are configured to mate with the bonding pads on semiconductor device 12. The metal of tape 30 is preferably a nickel alloy or iron alloy material as described with regard to the embodiment illustrated in FIG. 2. It is preferred that each finger include a bumped portion at the end which bonds to the semiconductor. However, it is also within the scope of the present invention to prepare flat tape and provide the bumps on the semiconductor device itself. An important advantage of using the transport tape is that all of the tape fingers may be gang bonded at the same time to the semiconductor device 12 at its bonding pads. Any number of fingers may be used and configured in any desired manner. For example, any of the fingers, such as fingers 36 may be of a longer length so as to reach any bonding terminal on the die as desired. The four corner fingers 22 preferably form the spring device 24. However, any of the fingers may be arched to form the spring device.

Referring again to FIG. 2, there is illustrated a high conductivity metal ring 40 which may be bonded near the apex of the curved lead fingers 22. The ring preferably has a conductivity of more than about 50% IACS. It may be attached by any suitable means such as a conductive adhesive like a metal powdered epoxy. The shape of the ring 40 could be of any desired configuration such as a doughnut shape or a hollow square. The ring may act as a supplementary heat sink or heat spreader within the package.

The spring device 24, with or without the ring 40, is disposed between the semiconductor die 12 and the base 14. The spring device forces the bottom face 42 of the semiconductor die against the inner surface 44 of the ceramic cover so as to enhance the thermal dissipation of the heat produced by the die through the cover. At the same time, the lead fingers 22 are drawing heat away from the enclosure as well as the central and peripheral surfaces of the die. The ring 40 assists in further conducting heat from the lead fingers 22 into the base 14 while adding rigidity and strength to the spring member.

Figure 4:
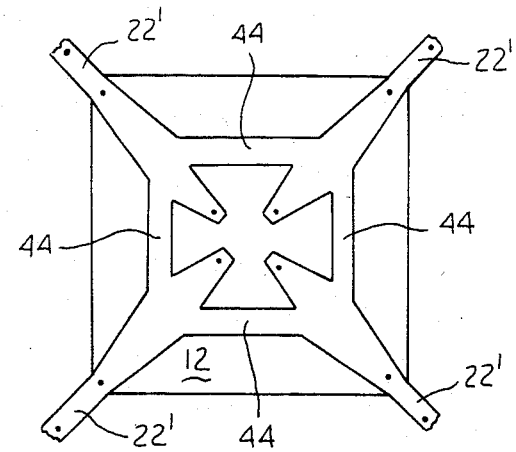
FIG. 4 is a schematic representation of the thermal dissipation leads of a stamped tape bonding material structure.

Referring to FIG. 4, there is shown another embodiment wherein the corner finger leads 22' (a modification of the leads 22 as shown in FIGS. 2 and 3) may have each of their arched portions joined together near the apex of the arch by a connecting bar 44. This connecting bar provides an additional advantage in that it strengthens the dissipation leads 22' and enhances the spring characteristics. The thermal dissipation leads may be formed in any configuration and are preferably wider within the area of the die as compared to the area external to the die. The increase in the width of the fingers 22' increases their rigidity and their heat dissipation characteristics. They are preferably tapered back to a smaller dimension at the point at which they are bonded to the terminal leads on the die so as to minimize the extent of the surface area on the die to be occupied by the terminal bonding pads. Although the configuration of the connecting bars 44, shown in FIG. 4, is substantially square, it is also within the terms of the present invention to form it in any desired shape and between any number of transport tape fingers. It should also be noted that although FIG. 4 only shows the corner fingers attached to the die, at the points indicated by the dots, any number of other fingers may be attached to terminal pads disposed at the peripheral or central locations of the die as described hereinabove.

Figure 5:
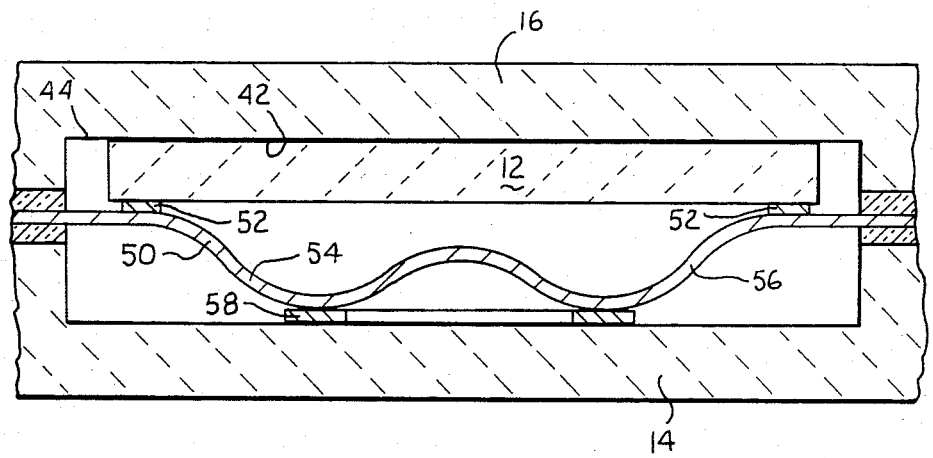
FIG. 5 is a schematic representation of a Tape Package in accordance with the present invention.

The embodiment of FIG. 5 is similar to FIG. 2 with the exception of the shape of the lead finger 50. In this embodiment, the cornered lead fingers may be attached opposite one another so as to form a single finger which could be bonded to opposite corners of the die 12. It is also thought, that the lead finger 50 would not be bonded to a central portion of the die but only to the peripherally located pads 52. The lead finger may be formed into two arched sections 54 and 56 so that the finger has a strong spring strength. As with the embodiment described in FIG. 2, a ring 58 may be bonded to the apex of each arched portion so as to improve the heat dissipation from the lead finger as well as to strengthen the finger and improve its functioning as a spring. As explained above, the lead finger 50 would press against the base 14, through the ring 58 if provided, to force the top surface 42 of the chip 12 against the inner surface 44 of the cover 16.

The improved Tape Package, as illustrated in FIGS. 2,4 and 5, has substantially improved thermal performance as compared to the prior art Tape Package 1. However, the heat dissipation characteristics of the improved package can still be optimized because the semiconductor die is pressed against the package which is made from a relatively low conductivity material such as a ceramic. Also, the heat dissipation leads, although now in close contact with the ceramic, continued to be made from relatively low thermal conductivity material described above.

The thermal dissipation characteristics of the Tape Package may be significantly improved by replacing the ceramic cover and base components with metal components that are a glass sealable.

Figure 6:
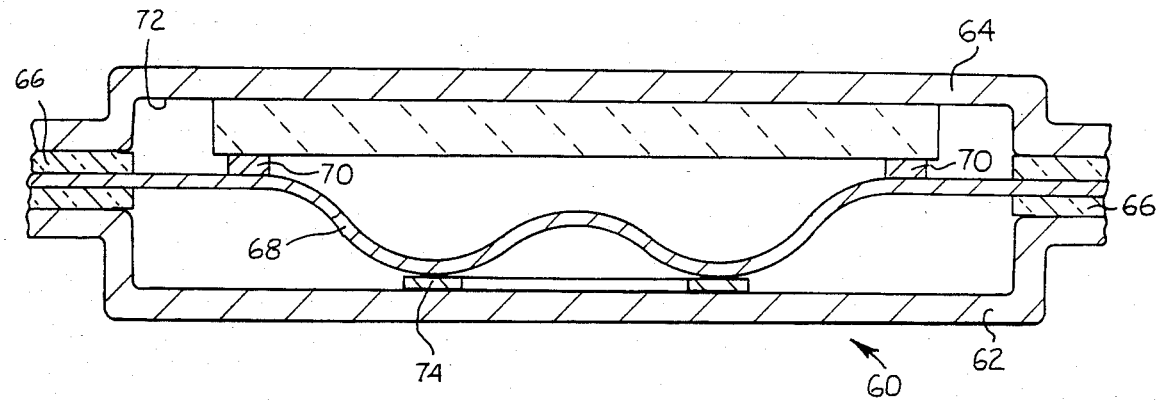
FIG. 6 is a schematic representation of a Tape Package having a metal casing.

Referring to FIG. 6, there is shown an embodiment of an improved Tape Package 60 which is fabricated from metal cover and base components 62 and 64. Since the metal components must be sealable to a glass bonding material 66, they may be formed of a glass sealable alloy such as copper alloy C63800 as disclosed in U.S. Pat. No. 3,676,292 to Pryor et al. Even more desirable would be to form the metal components from a high conductivity alloy having a conductivity of preferably more than 50% IACS. These might include copper alloys such as alloy C15100 or C11000. If necessary, it may be desirable to form the cover and base components of a biclad material which could include a relatively thin clad of glass sealable material to bond to the glass component and a relatively thick high conductivity metal or metal alloy to enhance the conductivity of the heat from the package. This also permits the use of a glass sealable copper alloy for the tape leads 68. The particular material of which the lead frame is made of is dependent upon its ability to bond with the glass sealing material 66. It can be understood, that the higher the conductivity of the metal or alloy lead frame the better the thermal dissipation from the package. Still, it must be kept in mind that the metal fingers must be bonded to the semiconductor die. Therefore, it may be necessary to provide a cladding on the fingers of an appropriate material such as for example a nickel copper alloy as described hereinabove. The cladding may be applied along the entire surface of the lead fingers and if desired etched away wherever deemed appropriate. The lead fingers may be connected to pads 70 provided along the peripheral edges of the die or to pads located more central to the die as desired and described and illustrated in FIGS. 2 and 5. The die fingers have an arch formed in them in order to provide sufficient spring tension so as to deflect the tape and press the die into contact with the inner surface 72 of the cover member 64. Also as described hereinabove, a contact ring 74 is preferably affixed to the apex of the arches formed in the lead fingers so as to strengthen the lead fingers and provide a supplementary heat sink or heat spreader within the package that is in contact with the base component 62.

Figure 7:
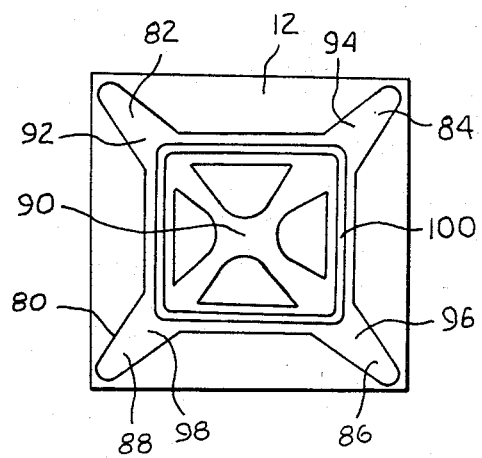
FIG. 7 is a schematic representation of a heat dissipation spring device.

Referring to FIG. 7, there is illustrated a spring heat dissipation device 80 which is formed similar to the heat dissipation lead shown in FIG. 4 described hereinabove. There are, however, some significant differences. First of all, the fingers 82, 84, 86 and 88 are joined together at their ends at section 90. Each of the fingers are arched with their apex located at section 92, 94, 96 and 98. The heat dissipation leads 82–88 are formed separately from any of the other lead fingers associated with the die 12. Heat dissipation leads are affixed onto terminal pads which are preferably located at the corners of the die. However, it is within the terms of the present invention to affix the spring device 80 to any position as desired. A contact ring 100 is bonded to the apex of the curves by a conductive adhesive such as any conventional metal, powdered dope epoxy. The spring heat dissipation device is preferably formed from an anneal resistant, high conductivity, high strength, metal alloy such as, for example, copper alloys C19400, C19500 or C15100. The alloy preferably has a minimum yield strength of about 60,000 psi. The anneal resistance is required so that it does not anneal at the glass bonding temperature so that the spring heat dissipation leads maintain sufficient spring tension. Also, the metal alloy preferably has a high conductivity which is more than about 50% IACS. It is also within the terms of the present invention to provide a cladding on the surface of the heat dissipation leads which are in contact with the terminal pads on the die so as to improve their bondability. The cladding could include a nickel or iron alloy of the type mentioned hereinabove.

Figure 8:
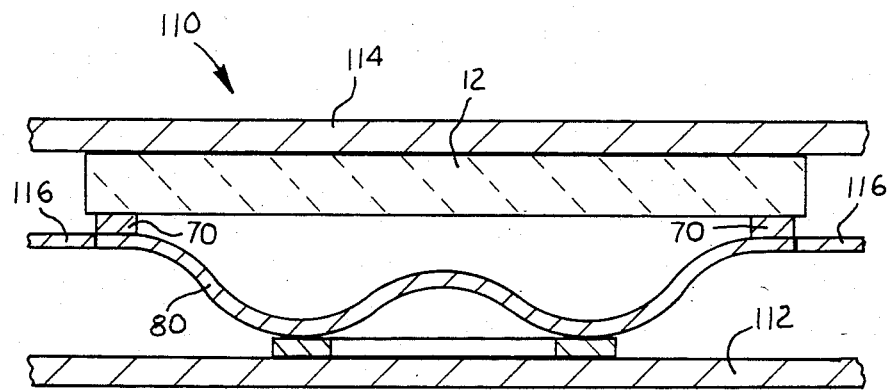
FIG. 8 is a schematic representation of a package with a spring device.

Referring to FIG. 8, there is illustrated the relationship between the spring heat dissipation device 80 and a Tape Package 110. As can be seen, the spring heat dissipation device is affixed onto the terminal pads of a chip 12. The contact ring 100 is disposed against the surface of a base component 112 of a package. The spring heat dissipation device presses the die 12 into mechanical contact with the inner surface of the cover component 114. Separate lead tape fingers 116, which are not part of the spring device 80, are bonded to the chip in a conventional manner, and are preferably formed of a material which is glass bondable. The connection of the die to the tape is more fully described in U.S. patent application Ser. No. 587,433 entitled "Tape Bonding Material and Structure For Electronic Circuit Fabrication" by Sheldon H. Butt. It should be understood that it is also within the terms of the present invention to provide the thermally conductive spring 80 in a package using a typical lead frame which is wire bonded to the die before enclosure of the package. Also, the spring thermal lead may be formed in any other configuration as long as it has spring characteristics which are sufficient to press the die against the cover.

It is also within the terms of the present invention to mount the die in the Tape Package so that it is pressed against the base member instead of the cover member as generally illustrated herein.

The claddings may be formed by an conventional techniques such as the POSIT-BOND bonding process described in U.S. Pat. No. 3,381,364.

The patents, patent applications and articles set forth in the specification are intended to be incorporated by reference herein.

It has been apparent that there has been provided in accordance with this invention Tape Packages which fully satisfy the objects, means and advantages set forth hereinbefore. While the invention has been described in combination with specific embodiments thereof, it is evident that many alternatives, modifications and variations would be apparent to those skilled in the art in light of the foregoing description. Accordingly, it is intended to embrace all such alternatives, modifications and variations as fall within the spirit and broad scope of the appended claims.

What is claimed is:

1. A tape package adapted to house an electronic component, comprising:
   a base component;
   a cover component disposed on said base component forming an enclosure to house said electronic component;
   a tape lead frame disposed between said base component and said cover component, said lead frame extending outward from said package and having a plurality of lead fingers extending into said enclosure, said lead fingers being adapted for electrical connection to said electronic component;
   spring means within said enclosure being adapted for pressing said electronic component into contact with said cover component, said spring means comprising at least a first of said lead fingers, said first of said lead fingers having a portion formed into an arch-like shape for pressing against said base component.

2. The tape package of claim 1 further including an electronic component, said electronic component having a plurality of peripherally disposed terminal bonding pads disposed about the periphery of its surface, and said first of said lead fingers being bonded to first and second peripherally disposed terminal bonding pads.

3. The tape package of claim 2 wherein said spring means further comprises at least a second of said lead fingers having a portion formed into an arch-like shape for pressing against said base component, said second of said lead fingers being bonded to third and fourth peripherally disposed terminal bonding pads.

4. The tape package of claim 3 wherein said electronic component further has a plurality of centrally disposed terminal bonding pads disposed on the surface of said electronic component central to the peripherally disposed bonding pads; and
   each portion of said first and second lead fingers with an arch-like shape being bonded to a peripherally disposed terminal pad and a centrally disposed terminal pad with the arch-like portion of each of said lead fingers extending between the centrally and peripherally disposed pads.

5. The tape package of claim 4 further including a contact ring bonded to the arch portions of the first and second lead fingers, said contact ring being in contact with the base component.

6. The tape package of claim 5 further including a glass bonding component for sealing the base component to the cover component.

7. The tape package of claim 6 wherein said base component and said cover component are formed of a ceramic material.

8. The tape package of claim 5 wherein said spring means comprises third and fourth lead fingers, said third and fourth lead fingers being bonded to at least a peripherally disposed terminal pad on said electronic component.

9. The tape package of claim 8 further including a connector bar connected to the portions of each of said lead fingers having an arch-like shape for stengthening said spring means and improving heat transfer from said electronic component.

10. The tape package of claim 9 wherein said connector bar is connected near the apex of the arch-like shape portion of each of the lead fingers.

11. The tape package of claim 10 wherein said contact ring is affixed to said connector bar.

12. A tape package housing an electronic component, comprising:
    a base component;
    a cover component disposed on said base component to form an enclosure to house said electronic component;
    a tape lead frame disposed between said base component and said cover component, said tape lead frame having a plurality of lead fingers extending into said enclosure and adapted for electrical connection to said electronic component;
    spring heat dissipation means between said base component and said electronic component for pressing said electronic component into contact with said cover component, said spring means comprising:
    at least one lead finger being bonded at its ends near opposite edges of said electronic component, said at least one lead finger formed into a first portion having a first arch shaped section between its ends and disposed in said enclosure whereby the apex of said first portion presses against the base component.

13. The tape package of claim 12 wherein said spring means further comprises at least a second lead finger formed into a second portion having an arched shaped section between its ends and joined to said first lead finger near a central portion of said first portion, said second lead finger being further connected at its ends near to opposite edges of said electronic component and disposed within said enclosure whereby the apex of the second portion presses against the base component.

14. The tape package of claim 13 further including connector bar means affixed to said first and second lead fingers for strengthening the spring means and enhancing heat dissipation from the tape package.

15. The tape package of claim 14 further including a glass bonding component for sealing the base component to the cover component.

16. The tape package of claim 15 wherein said base component and said cover component are formed of a metal material.

17. The tape package of claim 16 further including a contact ring affixed to said connector bar means and in contact with said metal base member for strengthening said spring means and enhancing the heat dissipation from said tape package.

18. The tape package of claim 17 wherein said spring means is formed of a copper alloy having a yield strength of at least 60,000 psi and a conductivity of at least about 50% IACS.

19. The tape package of claim 15 wherein said base component and said cover component are formed of a ceramic material.

20. The tape package of claim 19 wherein the first portion of said at least one lead fingers includes a second arch shaped section, the apex of said first and second arch shaped sections contacting the base component.

* * * * *